US010804348B2

(12) United States Patent
Kim

(10) Patent No.: US 10,804,348 B2
(45) Date of Patent: Oct. 13, 2020

(54) ORGANIC LIGHT EMITTING DISPLAY APPARATUS WITH AT LEAST ONE HOLE UNDER ENCAPSULATION LAYER AND METHOD OF MANUFACTURING THE SAME

(71) Applicant: LG DISPLAY CO., LTD., Seoul (KR)

(72) Inventor: KaKyung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/213,156

(22) Filed: Dec. 7, 2018

(65) Prior Publication Data

US 2019/0181205 A1 Jun. 13, 2019

(30) Foreign Application Priority Data

Dec. 8, 2017 (KR) ........................ 10-2017-0167883

(51) Int. Cl.
*H01L 27/32* (2006.01)
*H01L 51/52* (2006.01)
*H01L 51/56* (2006.01)

(52) U.S. Cl.
CPC ...... *H01L 27/3258* (2013.01); *H01L 27/3246* (2013.01); *H01L 27/3276* (2013.01); *H01L 51/5253* (2013.01); *H01L 51/56* (2013.01); *H01L 2227/323* (2013.01)

(58) Field of Classification Search
CPC ............. H01L 27/3258; H01L 27/3276; H01L 51/5253
See application file for complete search history.

(56) References Cited

U.S. PATENT DOCUMENTS

2016/0190389 A1* 6/2016 Lee ..................... H01L 51/5256 257/93
2017/0221976 A1 8/2017 Park et al.
2017/0271421 A1 9/2017 Jinbo et al.

FOREIGN PATENT DOCUMENTS

KR 20100024033 A 3/2010
KR 20130078231 A 7/2013
KR 20160001500 A 1/2016
KR 20160054822 A 5/2016
KR 20170078175 A 7/2017
KR 2017-0127874 A 11/2017
KR 2017-0128742 A 11/2017

OTHER PUBLICATIONS

Office Action dated Dec. 26, 2018 issued in the corresponding Patent Application No. 10-2017-0167883, pp. 1-8.
Notice of Allowance issued in counterpart Korean Application No. 2017-0167883 dated Jun. 25, 2019.

* cited by examiner

*Primary Examiner* — Quoc D Hoang
(74) *Attorney, Agent, or Firm* — Polsinelli PC

(57) ABSTRACT

Disclosed is an organic light emitting display apparatus and a method of manufacturing the same, which prevent an organic light emitting layer from being peeled from an anode electrode.

16 Claims, 15 Drawing Sheets

ORGANIC LIGHT EMITTING DISPLAY APPARATUS WITH AT LEAST ONE HOLE UNDER ENCAPSULATION LAYER AND METHOD OF MANUFACTURING THE SAME

CROSS REFERENCE TO RELATED APPLICATION

This application claims priority to Korean Patent Application No. 10-2017-0167883, filed on Dec. 8, 2017, which is hereby incorporated by reference in its entirety for all purposes as if fully set forth herein.

BACKGROUND

Field of the Invention

The present disclosure relates to an organic light emitting display apparatus and a method of manufacturing the same.

Discussion of the Related Art

With the advancement of information-oriented society, various requirements for display apparatuses for displaying an image are increasing. Therefore, various display apparatuses such as liquid crystal display (LCD) apparatuses, plasma display panels (PDPs), and organic light emitting display apparatuses are being used recently.

Organic light emitting display apparatuses are self-emitting display apparatuses and do not need a separate backlight. Therefore, in comparison with LCD apparatuses, the organic light emitting display apparatuses may be implemented to be lightweight and thin and to have low power consumption. Also, the organic light emitting display apparatuses are driven with a direct current (DC) low voltage, have a fast response time, and are low in manufacturing cost.

Organic light emitting display apparatuses include a plurality of subpixels each including an organic light emitting device. The organic light emitting device includes an anode electrode, an organic light emitting layer, and a cathode electrode. In this case, when a high-level voltage is applied to the anode electrode and a low-level voltage is applied to the cathode electrode, a hole and an electron move to the organic light emitting layer through a hole transport layer and an electron transport layer and are combined in the organic light emitting layer to emit light.

Recently, organic light emitting display apparatuses are implemented as flexible display apparatuses which have flexibility and are capable of being folded or bent, based on the requirement of market. In this case, the organic light emitting layer may be peeled from the anode electrode due to a stress which occurs when an organic light emitting display apparatus is folded or bent. When the organic light emitting layer is peeled from the anode electrode, the organic light emitting layer cannot normally emit light.

SUMMARY

Accordingly, the present disclosure is directed to provide an organic light emitting display apparatus and a method of manufacturing the same that substantially obviate one or more problems due to limitations and disadvantages of the related art.

An aspect of the present disclosure is directed to provide an organic light emitting display apparatus and a method of manufacturing the same, which prevent an organic light emitting layer from being peeled from an anode electrode.

In addition to the aforesaid objects of the present disclosure, other features and advantages of the present disclosure will be described below, but will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display apparatus comprising: a substrate; an organic light emitting device layer, disposed on the substrate, comprising a plurality of organic light emitting devices made of a first electrode, an organic light emitting layer, and a second electrode in an emission area; an encapsulation layer, disposed on the organic light emitting device layer, comprising an first inorganic layer and an organic layer, at least one hole, disposed in a non emission area and under the encapsulation layer, wherein the encapsulation layer extends downward and fills into the at least one hole.

In another aspect of the present disclosure, there is provided a method of manufacturing an organic light emitting display apparatus, the method comprising: forming a plurality of buffer layers on a substrate; forming a thin film transistor layer on the plurality of buffer layers, wherein the thin film transistor layer comprises thin film transistors and a passivation layer and a planarization layer disposed on the thin film transistors, forming a contact hole exposing a drain electrode of the thin film transistor and a first hole passing through the planarization layer and the passivation layer in a non-emission area; forming a first electrode on the planarization layer, the first electrode making contact to the drain electrode of the thin film transistor through the contact hole; forming a bank layer on the planarization layer, the bank layer covering a part of the first electrode and including a second hole exposing the first hole; wet etching through the second hole and the first hole a region including a part of insulation layers in the thin film transistor layer and a part of buffer layers of the plurality of buffer layers, and made of a same insulating material different from that of the layers immediately adjacent to the region to form a third hole, wherein the third hole has a larger width than at least a portion of the second hole and the third hole; depositing an organic light emitting layer and a second electrode layer on the first electrode and the bank layer, wherein the organic light emitting layer and the second electrode layer are disconnected in the third hole; forming an encapsulation layer on the second electrode layer, wherein the encapsulation layer includes an first inorganic layer and an organic layer, and extends downward and fills into the second hole, the first hole and the third hole.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
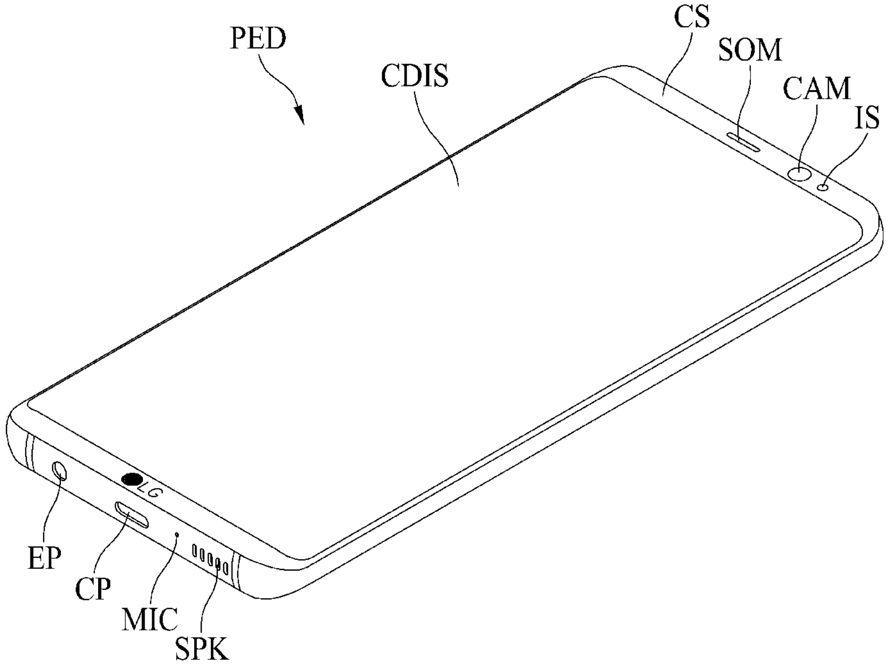
FIG. 1 is a perspective view illustrating a portable electronic device including an organic light emitting display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

In the specification, it should be noted that like reference numerals are used to denote like elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

Features of various embodiments of the present disclosure may be partially or overall coupled to or combined with each other, and may be variously inter-operated with each other as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

FIG. 1 is a perspective view illustrating a portable electronic device including an organic light emitting display apparatus according to an embodiment of the present disclosure.

Referring to FIG. 1, the portable electronic device PED according to an embodiment of the present disclosure is illustrated as a smartphone, but is not limited thereto. That is, the portable electronic device PED according to an embodiment of the present disclosure may be a tablet PC, a notebook computer, or the like. Also, the light emitting display apparatus according to an embodiment of the present disclosure may be applied to various electronic devices such as monitors and televisions (TVs), in addition to the portable electronic device PED.

The portable electronic device PED may include a case CS forming an external appearance, a display apparatus CDIS, a sound output module SOM, an image sensor CAM, an illumination sensor IS, a speaker SPK, a microphone MIC, an earphone port EP, and a charging port CP.

The case CS may be provided to cover a front surface, a side surface, and a rear surface of the portable electronic device PED. The case CS may be formed of plastic. The display apparatus CDIS, the sound output module SOM, and the image sensor (or a camera) CAM, and the illumination sensor IS may be disposed on the front surface of the case CS. The microphone MIC, the earphone port EP, and the charging port CP may be disposed on one side surface of the case CS.

The display apparatus CDIS may occupy the most region of the front surface of the portable electronic device PED. The display apparatus CDIS will be described in detail with reference to FIGS. 2 and 3.

The sound output module SOM may be a device that outputs a sound of the other party when talking over the portable electronic device PED such as a smartphone. The image sensor CAM may be a device for capturing an image seen in front of the portable electronic device PED, and another image sensor may be additionally disposed on the rear surface of the portable electronic device PED. The illumination sensor IS may be a device which senses the amount of incident light to control illuminance of the display apparatus CDIS. The microphone MIC may be a transmission device which converts a sound wave of a voice of a user into an electrical signal when talking with the other party, and transmits the electrical signal. The speaker SPK may output a sound signal associated with an application or a function executed in the portable electronic device PED. The earphone port EP may be a port which, when an earphone is inserted into the port, outputs a sound signal to the earphone, instead of the speaker SPK. The charging port CP may be a port to which a charger for charging a battery of the portable electronic device PED is connected.

Figure 2:
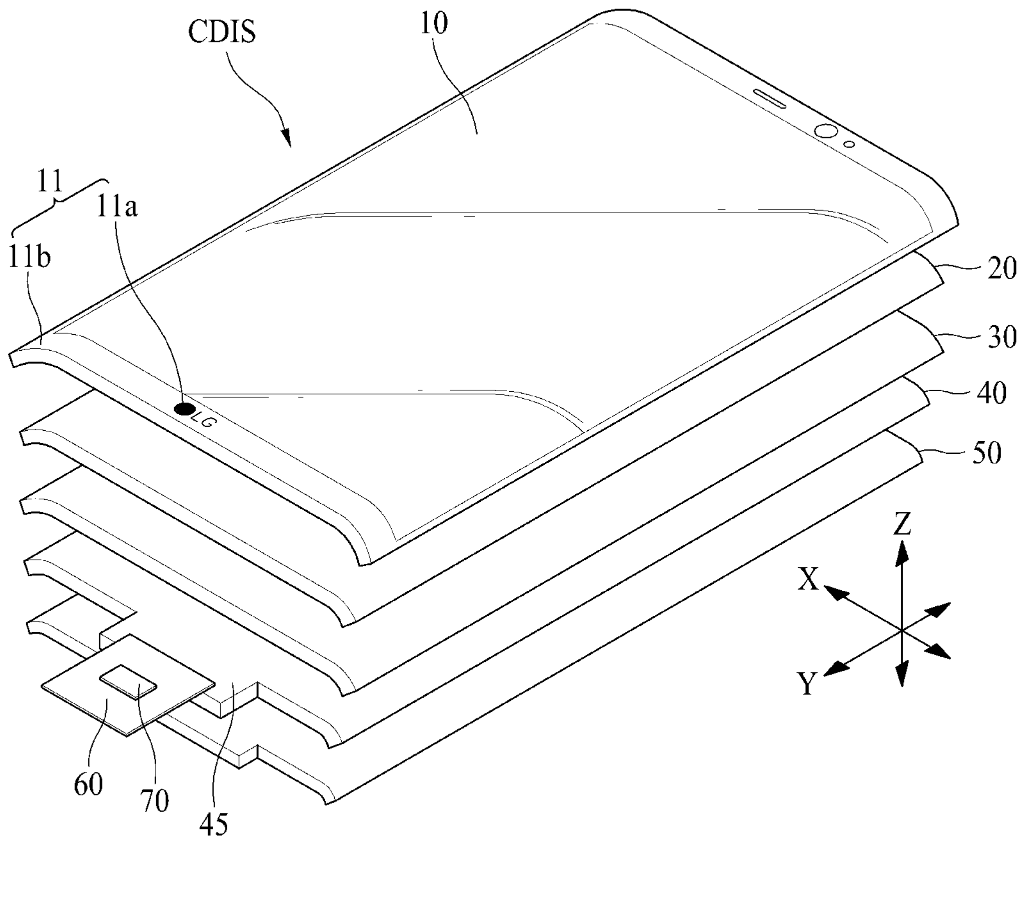
FIG. 2 is an exploded perspective view illustrating an organic light emitting display apparatus according to an embodiment of the present disclosure.

FIG. 2 is an exploded perspective view illustrating an organic light emitting display apparatus according to an embodiment of the present disclosure.

Referring to FIG. 2, the display apparatus according to an embodiment of the present disclosure may include a cover substrate 10, an adhesive film 20, a polarization film 30, a display module 40, a heat dissipation film 50, a flexible film 60, and an integration driving circuit 70.

The cover substrate 10 may be formed of plastic, glass, silicon or the like. The cover substrate 10 may include a flat part and a curvature part. The flat part may be flatly provided in a center region of the cover substrate 10. The curvature part may be provided in at least one edge of the cover substrate 10 to have a first curvature. In FIGS. 1 and 2, the curvature part is illustrated as being provided in each of both edges of the cover substrate 10, but embodiments of the present disclosure are not limited thereto. For example, in embodiments of the present disclosure, the curvature part may be provided in only one edge of the cover substrate 10, or may be provided in each of three edges or four edges. Also, in FIG. 2, the cover substrate 10 is illustrated as including a curvature part, but embodiments of the present disclosure are not limited thereto. For example, in embodiments of the present disclosure, the cover substrate 10 may include only the flat part.

The cover substrate 10 may include a decoration layer 11. The decoration layer 11 may be a layer including a pattern which is seen by a user even when the display module 40 does not display an image. The decoration layer 11 may include a letter pattern 11*a* and a color layer 11*b*. The letter pattern 11*a* may be a logo of a company such as "LG" as in FIG. 2. The color layer 11*b* may be provided in an area corresponding to a bezel area of the display module 40. In a case where the color layer 11*b* is provided in black, when the display module 40 does not display an image, the color layer 11*b* may be shown in the same color as that of a display area of the display module 40, and thus, a screen of the display module 40 is recognized as being widely seen as possible by a user.

The adhesive film 20 may be disposed on a rear surface of the cover substrate 10. The adhesive film 20 may attach the cover substrate 10 on the polarization film 30. The adhesive film 20 may be an optically cleared resin (OCR) or an optically cleared adhesive (OCA) film.

The polarization film 30 may be disposed on the rear surface of the cover substrate 10. The polarization film 30 prevents visibility from being degraded due to reflection of external light.

The display module 40 may be disposed on a rear surface of the polarization film 30. The display module 40 may be a display apparatus which displays an image. For example, the display module 40 may be an organic light emitting display apparatus, but embodiments of the present disclosure are not limited thereto.

The display module 40 may be disposed on the flat part and the curvature part of the cover substrate 10. Since the display module 40 is disposed in the curvature part of the cover substrate 10, a user may see an image through the curvature part of the cover substrate 10.

The display module 40 may include a bending part 45 which is provided by extending a portion of at least one side of the display module 40. For example, as in FIG. 2, the bending part 45 may be provided by extending a portion of a lower portion of the display module 40. The flexible film 60 may be attached on the bending part 45, and in order to minimize a bezel area, the bending part 45 and the flexible film 60 may be bent toward a rear surface of the heat dissipation film 50 and may be fixed to the heat dissipation film 50. The flexible film 60 may be implemented as a chip on film (COF) with the integration driving circuit 70 mounted thereon.

The heat dissipation film 50 may be disposed on the rear surface of the display module 40. The heat dissipation film 50 may include a material having high thermal conductivity so as to effectively dissipate heat occurring in the display module 40. Also, the heat dissipation film 50 may perform a buffering function for protecting the display module 40 from an external impact.

The integration driving circuit 70 may be implemented as a chip type like an integrated chip (IC) and may be attached on the flexible film 60 in a COF type. The integration driving circuit 70 may be a driving circuit into which a data driving circuit, a timing control circuit, a power supply circuit, and a gamma voltage circuit are integrated.

The data driving circuit may be a circuit which generates data voltages from gamma voltages generated by the gamma voltage circuit and supplies the data voltages to data lines of the display module 40, and the timing control circuit may be a circuit which controls an operation timing of the data driving circuit and an operation timing of a scan driving circuit provided in the display module 40. Also, the power supply circuit may be a circuit which generates and supplies driving voltages necessary for the data driving circuit, the timing control circuit, the gamma voltage circuit, and the scan driving circuit. Also, the gamma voltage circuit may be a circuit which supplies the gamma voltages to the data driving circuit.

Figure 3:
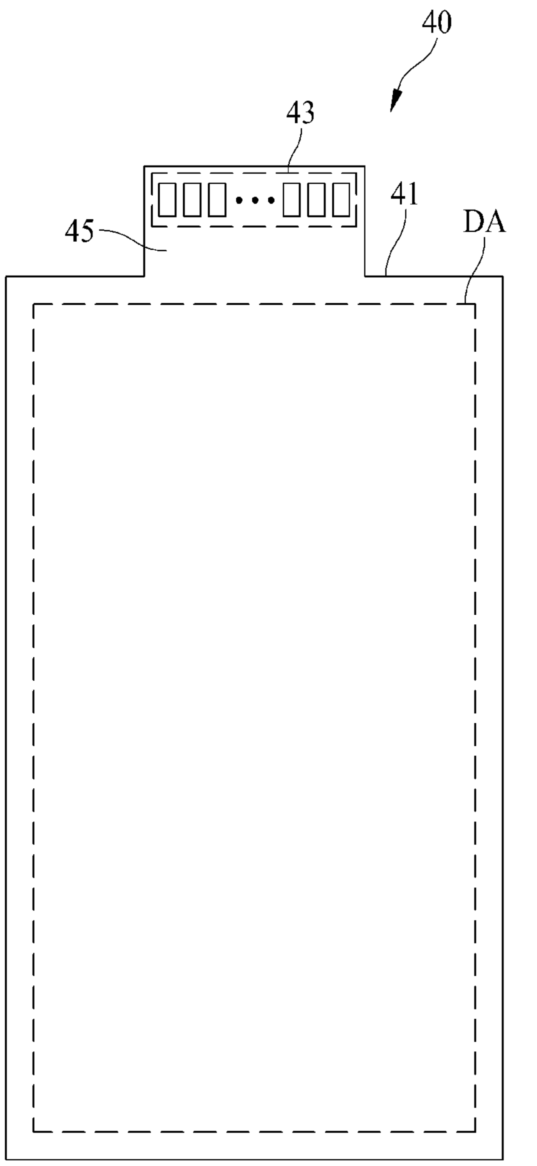
FIG. 3 is a plan view illustrating a display module of FIG. 2 in detail.

FIG. 3 is a plan view illustrating in detail the display module 40 of FIG. 2.

Referring to FIG. 3, the display module 40 according to an embodiment of the present disclosure may include a substrate 41, a scan driving circuit which is provided in a non-display area of the substrate 41, a bending part 45 which is provided to extend at least one side of the substrate 41, and a pad part 43 which is provided in the bending part 45.

The substrate 41 may include a supporting substrate and a flexible substrate 41*b*.

The supporting substrate may be a substrate for supporting the flexible substrate 41*b* and may be formed of plastic. For example, the supporting substrate may be formed of polyethylene terephthalate (PET). The supporting substrate may not be provided in the bending part 45.

The flexible substrate 41*b* may be disposed on the supporting substrate and may be formed of a plastic film having flexibility. For example, the flexible substrate 41*b* may be formed of a polyimide film.

A pixel array layer may be provided on the flexible substrate 41*b*, and a display area DA which displays an image and the scan driving circuit and the pad part 43 provided in a non-display area except the display area DA may be provided on the flexible substrate 41*b*.

The display area DA may be an area where a plurality of scan lines, a plurality of data lines, and a plurality of subpixels are provided to display an image. The scan lines may be arranged in a first direction (an X-axis direction), and the data lines may be arranged in a second direction (a Y-axis direction) intersecting the first direction. The plurality of subpixels may be respectively provided in a plurality of areas defined by intersections of the scan lines and the data lines. The plurality of subpixels, as in FIG. 5, may include a subpixel driver PDR, an emission part EA, and holes EH1 and EH2. The display area DA will be described below in detail with reference to FIGS. 4 and 5.

The scan driving circuit may receive a scan control signal from the integration driving circuit 70, generate scan signals according to the scan control signal, and sequentially supply the scan signals to the scan lines. Therefore, data voltages may be supplied to pixels connected to a scan line when the scan signal is supplied.

The scan driving circuit, as in FIG. 3, may be disposed outside both sides of the display area DA, but embodiments of the present disclosure are not limited thereto. That is, in embodiments of the present disclosure, the scan driving circuit may be disposed outside only at least one side of the display area DA.

The pad part 43 may be an area where a plurality of pads PD is provided. The flexible film 60 may be attached on the pad part 43 by using an anisotropy conductive film. Therefore, data voltages, source voltages, and the scan control signal output from the integration driving circuit 70 may be supplied to the pad part 43. The pads PD may be connected to, through a plurality of link lines, the data lines provided in the display area DA, connected to the scan driving circuit, or connected to a plurality of power lines for supplying the source voltages. Accordingly, the data voltages of the integration driving circuit 70 may be supplied to the data lines provided in the display area DA, the scan control signal may be supplied to the scan driving circuit, and the source voltages may be supplied to the power lines. The pad part PD will be described below in detail with reference to FIGS. 6 and 8.

Figure 4:
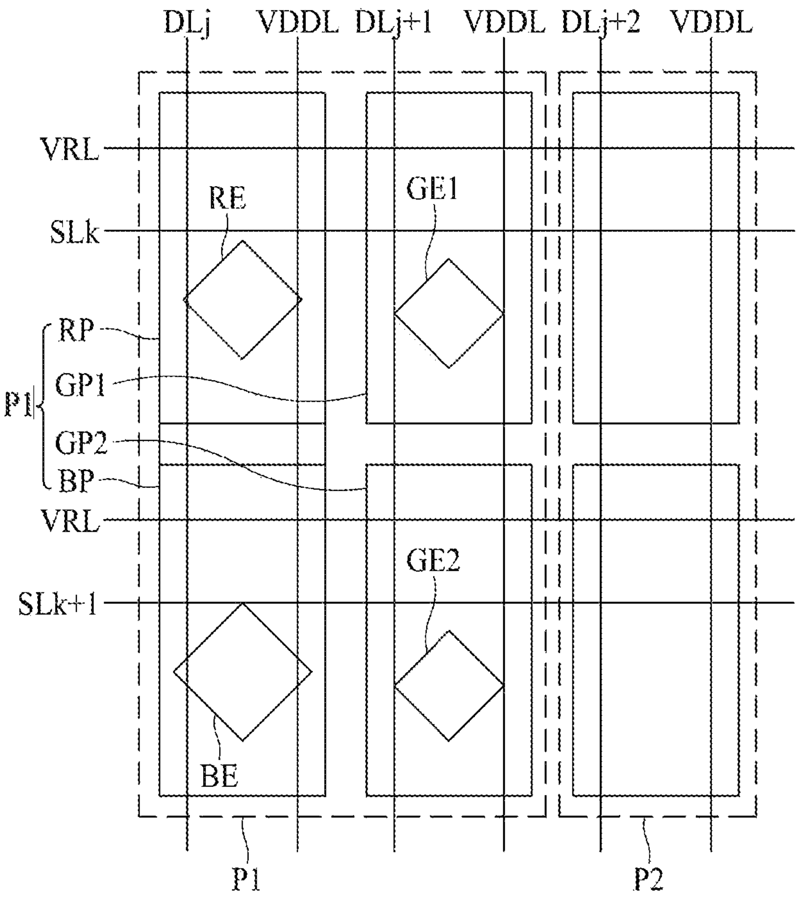
FIG. 4 is a plan view schematically illustrating pixels in a display area of FIG. 3.

FIG. 4 is a plan view schematically illustrating pixels in the display area of FIG. 3.

In FIG. 4, for convenience of description, only subpixels of first and second pixels P1 and P2 provided in a plurality of areas defined by intersections of a kth scan line SLk, a (k+1)th scan line SLk+1, a jth data line DLj, a (j+1)th data line DLj+1, and a (j+2)th data lines DLj+2 are illustrated.

Referring to FIG. 4, the kth scan line SLk and the (k+1)th scan line SLk+1 may be arranged in a first direction (an X-axis direction), and the jth data line DLj, the (j+1)th data line DLj+1, and the (j+2)th data lines DLj+2 may be arranged in a second direction (a Y-axis direction). An initialization voltage line VRL may be provided in the first direction (the X-axis direction) in parallel with the scan lines SLk and SLk+1, and a high level voltage line (hereinafter referred to as first source voltage line) VDDL may be provided in the second direction (the Y-axis direction) in parallel with the data lines DLj, DLj+1, and DLj+2.

The first and second pixels P1 and P2 may each include a plurality of subpixels. For example, as in FIG. 4, the first and second pixels P1 and P2 may each include a red subpixel RP, a blue subpixel BP, and first and second green subpixels GP1 and GP2. However, embodiments of the present disclosure are not limited thereto. That is, in embodiments of the present disclosure, the first and second pixels P1 and P2 may each include at least one red subpixel, at least one green subpixel, and at least one blue subpixel. Alternatively, in embodiments of the present disclosure, the first and second pixels P1 and P2 may each include a plurality of subpixels having a color combination of yellow, cyan, and magenta, in addition to a plurality of subpixels having a color combination of red, green, and blue.

Each of the red subpixel RP, the blue subpixel BP, and the first and second green subpixels GP1 and GP2 may be provided in an area defined by intersection of one scan line and one data line. Also, each of the red subpixel RP, the blue subpixel BP, and the first and second green subpixels GP1 and GP2 may be provided in an area defined by intersection of one scan line and one first source voltage line VDDL, an area defined by intersection of one initialization voltage line VRL and one data line, and an area defined by intersection of one initialization voltage line VRL and one first source voltage line VDDL.

The red subpixel RP may include a red emission part RE, the blue subpixel BP may include a blue emission part BE, the first green subpixel GP1 may include a first green emission part GE1, and the second green subpixel GP2 may include a second green emission part GE2. For example, in FIG. 4, each of the red subpixel RP, the blue subpixel BP, and the first and second green subpixels GP1 and GP2 is illustrated as being provided in a lozenge shape, but embodiments of the present disclosure are not limited thereto. In other embodiments, each of the red subpixel RP, the blue subpixel BP, and the first and second green subpixels GP1 and GP2 may be provided in a polygonal shape such as a triangular shape, a tetragonal shape, a pentagonal shape, a hexagonal shape, a heptagonal shape, or an octagonal shape, or may be provided in a circular shape or an elliptical shape.

Also, in FIG. 4, an example where a size of the blue emission part BE is greater than that of the red emission part RE and a size of the red emission part RE is greater than that of each of the first green emission part GE1 and the second green emission part GE2 is illustrated, but embodiments of the present disclosure are not limited thereto.

Moreover, in FIG. 4, an example where the emission parts RE, BE, GE1, and GE2 of the subpixels RP, BP, GP1, and GP2 are arranged in a rectangular shape is illustrated, but embodiments of the present disclosure are not limited thereto. In other embodiments, in embodiments of the present disclosure, the emission parts RE, BE, GE1, and GE2 of the subpixels RP, BP, GP1, and GP2 may be arranged in a pentile form, but embodiments of the present disclosure are not limited thereto.

Figure 5:
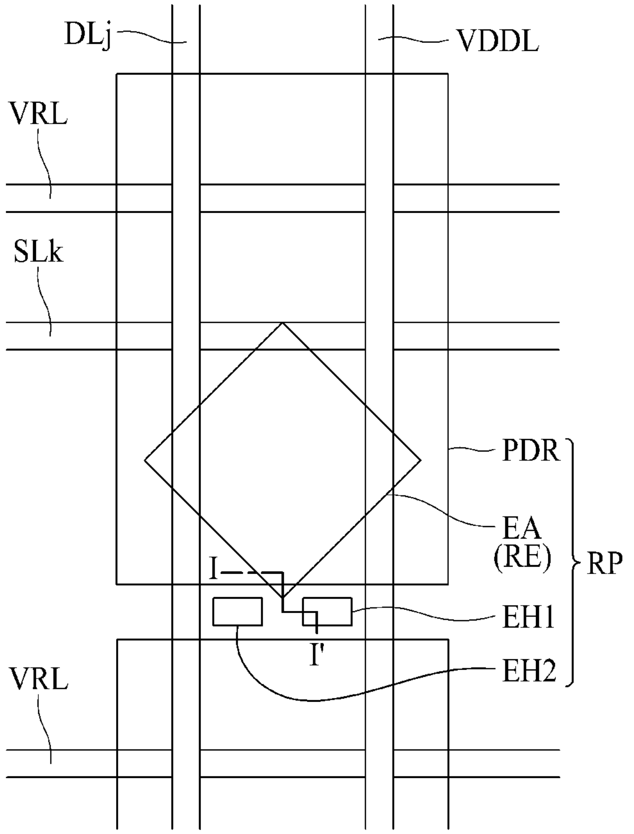
FIG. 5 is a plan view illustrating in detail a first subpixel of FIG. 4.

FIG. 5 is a plan view illustrating in detail a red subpixel RP provided in an area defined by intersection of the kth scan line and the jth data line of FIG. 4.

Referring to FIG. 5, the red subpixel RP may include a pixel driver PDR, a red emission part RE, and holes EH1 and EH2.

The pixel driver PDR may be provided to overlap a kth scan line SLk, a jth data line DLj, an initialization voltage line VRL, and a first source voltage line VDDL. The pixel driver PDR may include a plurality of transistors and at least one capacitor. For example, the pixel driver PDR may include a driving transistor which controls the amount of current supplied to a light emitting device of an emission part RE through a high level voltage line VDDL according to a data voltage supplied to a gate electrode thereof, a first scan transistor which supplies a data voltage of the jth data line DLj to the gate electrode of the driving transistor when a scan signal of the kth scan line SLk is input thereto, and a second scan transistor which initializes the gate electrode of the driving transistor to a reference voltage of the initialization voltage line VRL when a scan signal of the a (k−1)th scan line SLk−1 is input thereto.

The red emission part RE may include a light emitting device including a first electrode, a light emitting layer, and a second electrode. The first electrode may be an anode electrode, and the second electrode may be a cathode electrode. In detail, the red emission part RE may denote an area where the first electrode corresponding to the anode electrode, the light emitting layer, and the second electrode corresponding to the cathode electrode are sequentially stacked, and a hole from the first electrode and an electron from the second electrode are combined in the light emitting layer to emit light. Here, the light emitting layer may be an organic light emitting layer.

Figure 7:
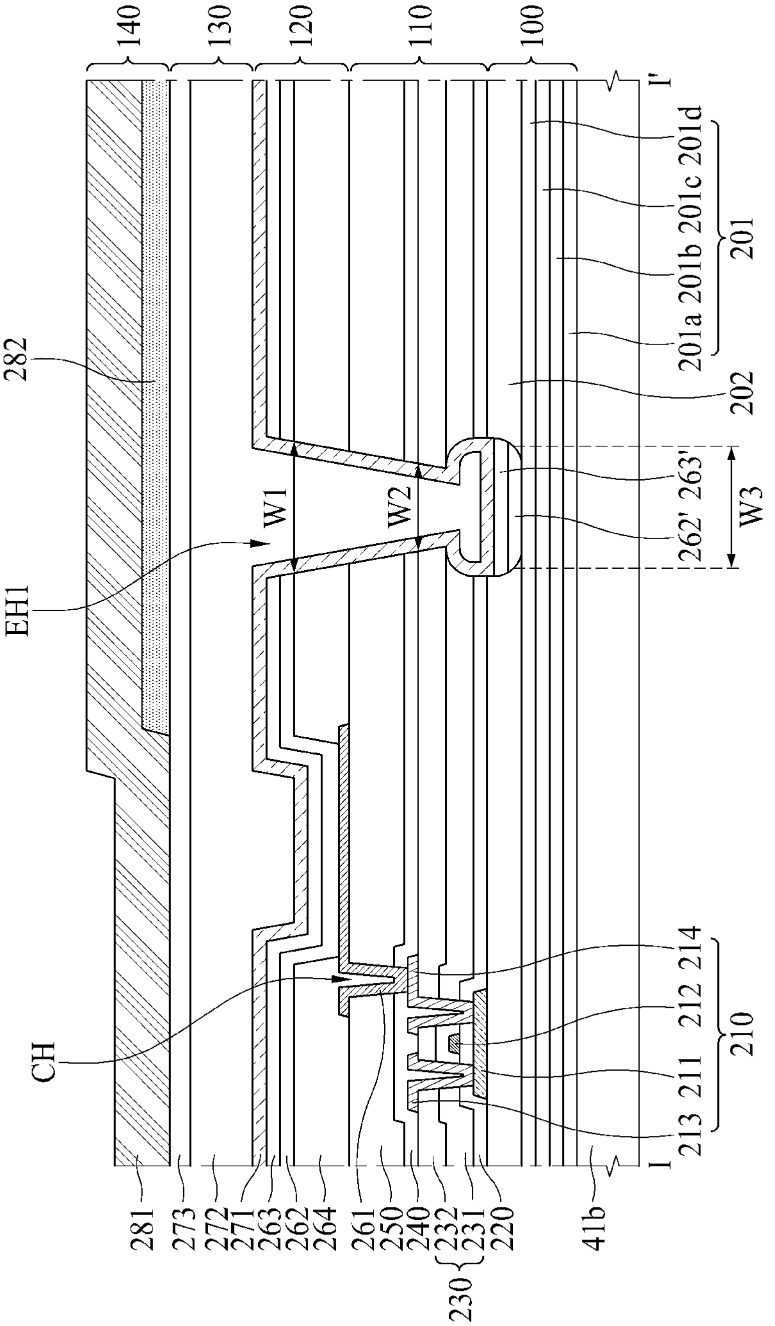
FIG. 7 is a cross-sectional view illustrating an example taken along line I-I' of FIG. 5.

The pixel driver 210, as in FIG. 7, may be provided on a thin film transistor (TFT) layer 110, and the red emission part RE, as in FIG. 7, may be provided on a light emitting device layer 120. In this case, the red emission part RE may be provided as a top emission type where light is emitted in an upward direction, and thus, the red emission part RE may be provided to overlap the pixel driver PDR. Also, the red emission part RE may be provided to overlap at least one of the kth scan line SLk, the jth data line DLj, the initialization voltage line VRL, and the first source voltage line VDDL, in addition to the pixel driver PDR.

Each of the holes EH1 and EH2 may be a hole into which an encapsulation layer disposed on the light emitting device layer 120 including the red emission part RE is filled. The encapsulation layer may include at least one inorganic layer and at least one organic layer, and in this case, an organic layer may be filled into each of the holes EH1 and EH2. Therefore, even when an organic light emitting display apparatus is folded or bent, an organic layer disposed on the red emission part RE may be filled into and fixed to each of the holes EH1 and EH2, thereby preventing the organic light emitting layer from being peeled from the anode electrode.

As a depth of each of the holes EH1 and EH2 becomes deeper, an effect for fixing the organic light emitting layer to the organic layer is large, and thus, as in FIG. 7, it is preferable that the holes EH1 and EH2 may be provided to pass through the TFT layer 110. To this end, the holes EH1 and EH2 may be provided not to overlap the pixel driver PDR and the red emission part RE. Also, the holes EH1 and EH2 are provided not to overlap scan lines, data lines, initialization voltage lines VRL, and first source voltage lines VDDL. That is, in a case where the holes EH1 and EH2 do not overlap a metal layer and a semiconductor layer provided on the TFT layer 110 and a metal layer provided on the light emitting device layer 120, the holes EH1 and EH2 may be provided to pass through the TFT layer 110.

In FIG. 5, the red subpixel RP is illustrated as including two holes EH1 and EH2, but embodiments of the present disclosure are not limited thereto. However, as an area of a hole becomes wider, an effect where the organic light emitting layer is fixed to the organic layer is large. However, since an area of the pixel driver PDR and an area of the red emission part RE are reduced, an area of a hole may be appropriately designed in consideration of the reduction in area.

In FIG. 5, for convenience of description, only a red subpixel RP of a first pixel P1 is illustrated, and a blue subpixel BP, a first green subpixel GP1, and a second green subpixel GP2 of the first pixel P1 may be substantially the same as the red subpixel RP described above with reference to FIG. 5. Therefore, detailed descriptions of the blue subpixel BP, the first green subpixel GP1, and the second green subpixel GP2 of the first pixel P1 are omitted.

Figure 6:
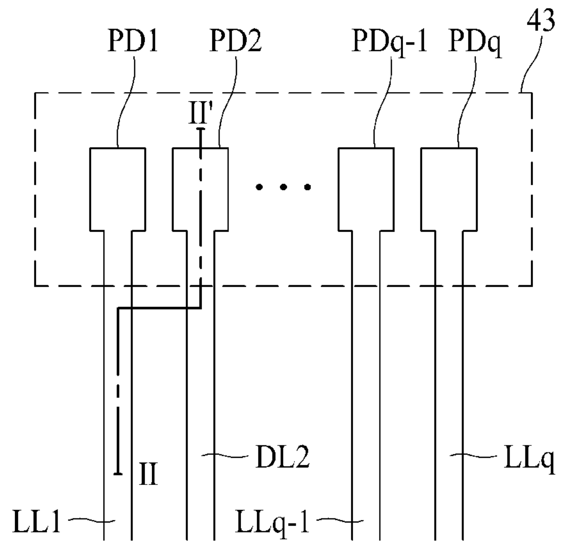
FIG. 6 is a plan view schematically illustrating a pad part of FIG. 3.

FIG. 6 is a plan view schematically illustrating the pad part 43 of FIG. 3.

Referring to FIG. 6, the pad part 43 may include a plurality of pads PD1 to PDq. The plurality of pads PD1 to PDq may be respectively connected to a plurality of link lines LL1 to LLq. The plurality of link lines LL1 to LLq may be connected to the data lines provided in display area DA, a scan control line connected to the scan driving circuit, the initialization voltage line VRL, the first source voltage line VDDL, or a second source voltage line connected to the second electrode of OLED corresponding to the cathode electrode.

The flexible film 60 may be attached on the plurality of pads PD1 to PDq. The flexible film 60 may include a plurality of conductive leads, and the plurality of pads PD1 to PDq may be respectively connected to the conductive leads of the flexible film 60 through an anisotropy conductive film.

FIG. 7 is a cross-sectional view illustrating an example taken along line I-I' of FIG. 5.

Hereinafter, a cross-sectional surface of each of the pixel driver PDR, the emission part RE, and the hole EH1 provided in the display area DA will be described in detail with reference to FIG. 7.

A substrate 41 may include a supporting substrate and a flexible substrate 41*b*. The supporting substrate may be a substrate for supporting the flexible substrate 41*b* and may be formed of plastic. For example, the supporting substrate may be formed of PET. The flexible substrate 41*b* may be disposed on the supporting substrate 41 and may be formed of a plastic film having flexibility. For example, the flexible substrate 41*b* may be formed of a polyimide film.

A buffer layer 100 may be provided on the substrate 41. The buffer layer 100 protects TFTs and light emitting devices from water ($H_2O$) or oxygen ($O_2$) which penetrates into the inside through the substrate 41 vulnerable to penetration of water. The buffer layer 100 may include a multi buffer layer 201 and an active buffer layer 202.

The multi buffer layer 201 may include a plurality of buffer layers (for example, first to fourth buffer layers) 201*a* to 201*d* which are alternately stacked. For example, the first and third buffer layers 201*a* and 201*c* of the multi buffer layer 201 may each be formed of silicon oxide (SiOx), and the second and fourth buffer layers 201*b* and 201*d* may each be formed of silicon nitride (SiNx).

The active buffer layer 202 may be disposed on the multi buffer layer 201. The active buffer layer 202 may be formed of SiOx.

The TFT layer 110 may be provided on the buffer layer 100. The TFTs 210, scan lines, data lines, initialization voltage lines, and first source voltage lines may be provided on the TFT layer 110.

The TFTs 210 may each include an active layer 211, a gate electrode 212, a source electrode 213, and a drain electrode 214. In FIG. 7, the TFTs 210 are exemplarily illustrated as being formed as a top gate type in which the gate electrode 212 is disposed on the active layer 211, but embodiments of the present disclosure are not limited thereto. In other embodiments, the TFTs 210 may be formed as a bottom gate type where the gate electrode 212 is disposed under the active layer 211 or a double gate type where the gate electrode 212 is disposed both on and under the active layer 211.

The active layer 211 may be provided on the buffer layer 100. The active layer 211 may be formed of a silicon-based semiconductor material, an oxide-based semiconductor material, and/or the like. The silicon-based semiconductor material may use amorphous silicon or polycrystalline silicon which has mobility better than amorphous silicon, is low in consumption power, and is good in reliability.

Examples of the oxide-based semiconductor material may include an InSnGaZnO-based material which is four-element metal oxide, an InGaZnO-based material, an InSnZnO-based material, an InAlZnO-based material, a SnGaZnO-based material, an AlGaZnO-based material, and a SnAlZnO-based material which are three-element metal oxide, and an InZnO-based material, SnZnO-based material, AlZnO-based material, ZnMgO-based material, SnMgO-based material, InMgO-based material, InGaO-based material, which are two-element metal oxide, InO-based material, SnO-based material, and ZnO-based material, but a composition ratio of elements is not limited thereto.

The active layer 211 may include a source region and a drain region which include p-type or n-type impurities, and a channel formed between the source region and the drain region, and may include a low concentration doping region between the source region and the drain region adjacent to the channel.

A light blocking layer for blocking external light incident on the active layer 211 may be provided between the buffer layer 110 and the active layer 211.

A gate insulation layer 220 may be formed on the active layer 211. The gate insulation layer 220 may be formed of an inorganic layer, and for example, may be formed of SiOx, SiNx, or a multilayer thereof.

The gate electrode 212, the scan lines, and the initialization voltage lines VRL may be provided on the gate insulation layer 220. The gate electrode 212, the scan lines, and the initialization voltage lines VRL may each be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

An interlayer insulation layer 230 may be provided on the gate electrode 212, the scan lines, and the initialization voltage lines VRL. The interlayer insulation layer 230 may include a first interlayer insulation layer 231 and a second interlayer insulation layer 232. The first interlayer insulation layer 231 may be formed of SiOx, and the second interlayer insulation layer 232 may be formed of SiNx.

The source electrode 213, the drain electrode 214, the data lines, and the first source voltage lines VDDL may be provided on the interlayer insulation layer 230. Each of the source electrode 213 and the drain electrode 214 may be connected to the active layer 211 through a contact hole which penetrates the gate insulation layer 220 and the interlayer insulation layer 230. The source electrode 213, the drain electrode 214, the data lines, and VDDL may each be formed of a single layer or a multilayer which includes one of Mo, Al, Cr, Au, Ti, Ni, Nd, and Cu, or an alloy thereof.

A passivation layer 240 for insulating the TFTs 210 may be provided on the source electrode 213, the drain electrode 214, the data lines, and the first source voltage lines VDDL. The passivation layer 240 may be formed of SiNx.

A planarization layer 250 for planarizing a step height caused by the TFTs 210 may be formed on the passivation layer 240. The planarization layer 250 may be formed of an organic layer such as acryl resin, epoxy resin, phenolic resin, polyamide resin, polyimide resin, or the like.

The light emitting device layer 120 may be provided on the TFT layer 110. The light emitting device layer 120 may include a plurality of light emitting devices and a bank 264. In FIG. 7, an example where the light emitting device layer 120 emits light in the top emission type is described, but embodiments of the present disclosure are not limited thereto. In other embodiments, the light emitting device layer 120 may emit light in the bottom emission type.

The light emitting devices and the bank 264 may be provided on the planarization layer 250. The light emitting devices may each include a first electrode 261, a light emitting layer 262, and a second electrode 263. The first electrode 261 may be an anode electrode, and the second electrode 263 may be a cathode electrode.

The first electrode 261 may be formed on the planarization layer 250. The first electrode 261 may be connected to the drain electrode 214 of the TFT 210 through a contact hole CH which penetrates the passivation layer 240 and the planarization layer 250. The first electrode 261 may be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

The bank 264 may be provided on the planarization layer 250 to cover a portion of the first electrode 261. The bank 264 may be a pixel defining layer which defines emission parts of a plurality of subpixels. That is, the emission parts may each be an area where the first electrode 261, the light emitting layer 262, and the second electrode 263 are sequentially stacked, and a hole from the first electrode 261 and an electron from the second electrode 263 are combined in the light emitting layer 262 to emit light. An area where the bank 264 is provided may be a non-emission area. The bank 264 may be formed of an organic layer such as acryl resin, epoxy resin, phenolic resin, polyamide resin, polyimide resin, or the like.

A spacer may be provided on the bank 264. The spacer may be formed of an organic layer such as acryl resin, epoxy resin, phenolic resin, polyamide resin, polyimide resin, or the like.

The light emitting layer 262 may be provided on the first electrode 261 and the bank 264. The light emitting layer 262 may include a hole transport layer, an organic light emitting layer, and an electron transport layer. The hole transport layer may smoothly transfer a hole, injected from the first electrode 261, to the organic light emitting layer. The organic light emitting layer may be formed of an organic material including a phosphorescent or fluorescent material. The electron transport layer may smoothly transfer an electron, injected from the second electrode 263, to the organic light emitting layer. The light emitting layer 262 may further include a hole injection layer (HIL), a hole blocking layer (HBL), an electron injection layer (EIL), and an electron blocking layer (EBL), in addition to the hole transport layer, the organic light emitting layer, and the electron transport layer.

Moreover, the light emitting layer 262 may be provided in a tandem structure of two or more stacks. Each of the stacks may include a hole transport layer, an organic light emitting layer, and an electron transport layer. If the light emitting layer 262 is provided in the tandem structure of two or more stacks, a charge generation layer may be provided between adjacent stacks. The charge generation layer may include an n-type charge generation layer, disposed adjacent to a lower stack, and a p-type charge generation layer which is provided on the n-type charge generation layer and is disposed adjacent to an upper stack. The n-type charge generation layer may inject an electron into the lower stack, and the p-type charge generation layer may inject a hole into the upper stack. The n-type charge generation layer may be formed of an organic layer where an organic host material having an ability to transport electrons is doped with alkali metal, such as lithium (Li), sodium (Na), potassium (K), or cesium (Cs), or alkali earth metal such as magnesium (Mg), strontium (Sr), barium (Ba), or radium (Ra). The p-type charge generation layer may be an organic layer where a dopant is doped on an organic host material having an ability to transport holes.

The light emitting layer 262 may be a common layer which is provided in the pixels in common, and in this case, may be a white light emitting layer that emits white light. However, embodiments of the present disclosure are not limited thereto. In other embodiments, the light emitting layer 262 may be provided in each subpixel, and in this case, may be divided into a red light emitting layer which emits red light, a green light emitting layer which emits green light, and a blue light emitting layer which emits blue light.

The second electrode 263 may be provided on the light emitting layer 262. The second electrode 263 may be provided to cover the light emitting layer 262. The second electrode 263 may be a common layer which is provided in the pixels in common.

The second electrode 263 may be formed of a transparent conductive material (or TCO), such as indium tin oxide (ITO) or indium zinc oxide (IZO) capable of transmitting light, or a semi-transmissive conductive material such as magnesium (Mg), silver (Ag), or an alloy of Mg and Ag. If the second electrode 263 is formed of a semi-transmissive conductive material, emission efficiency is enhanced by a micro-cavity. A capping layer may be formed on the second electrode 263.

The encapsulation layer 130 may be formed on the light emitting device layer 120. The encapsulation layer 130 prevents oxygen or water from penetrating into the light emitting layer 262 and the second electrode 263. To this end, the encapsulation layer 130 may include at least one inorganic layers (for example, first and second inorganic layers) 271 and 273. For example, each of the at least one inorganic layers 271 and 273 may be formed of at least one of silicon nitride, aluminum nitride, zirconium nitride, titanium nitride, hafnium nitride, tantalum nitride, silicon oxide, aluminum oxide, and titanium oxide.

The encapsulation layer 130 may include at least one organic layer 272 which is formed to have a sufficient thickness, for acting as a particle cover layer which prevents particles from penetrating into the light emitting layer 262 and the second electrode 263. The organic layer 272 may be formed of a transparent material for transmitting light emitted from the light emitting layer 262. The organic layer 272 may be formed of an organic material for transmitting 99% of the light emitted from the light emitting layer 262, and for example, may be formed of acryl resin, epoxy resin, phenolic resin, polyamide resin, polyimide resin, and/or the like, but is not limited thereto.

In FIG. 7, an example where the first inorganic layer 271 is provided on the second electrode 263, the organic layer 272 is provided on the first inorganic layer 271, and the second inorganic layer 273 is provided on the organic layer 272 is illustrated, but embodiments of the present disclosure are not limited thereto.

Depending on the case, a color filter layer 140 may be provided on the encapsulation layer 130. The color filter layer 140 may include a plurality of color filters 281 and a black matrix 282. The color filters 281 may be respectively disposed in correspondence with the emission parts of the subpixels. The black matrix 282 may be disposed between adjacent color filters 281, for preventing color mixture from occurring because light emitted from one pixel travels to the color filter 281 of an adjacent pixel. The black matrix 282 may be disposed in correspondence with the bank 264. An overcoat layer may be provided on the color filters 281, for planarizing a step height caused by the color filters 281 and the black matrix 282.

A barrier film may be disposed on the color filters 281. The barrier film may be a layer for protecting the light emitting device layer 120 from oxygen or water. The barrier film may include a touch sensing layer for sensing a user touch.

A hole EH1 passing through the bank 264, the planarization layer 250, the passivation layer 240, the second interlayer insulation layer 232, the first interlayer insulation layer 231, the gate insulation layer 220, and the active buffer layer 202 may be provided in a non-emission area where the bank 264 is provided. The hole EH1 may be provided so that a width from the bank 284 to the second interlayer insulation layer 232 is progressively narrowed. That is, a width W1 of the hole EH1 in the bank 264 may be set wider than a width W2 of the hole EH1 in the second interlayer insulation layer 232. Also, the width W2 of the hole EH1 in the second interlayer insulation layer 232 may be set narrower than a width of the hole EH1 in the first interlayer insulation layer 231, a width of the hole EH1 in the gate insulation layer 220, and a width W3 of the hole EH1 in the active buffer layer 202. A lower surface of the second interlayer insulation layer 232 may be provided so as to be exposed at the hole EH1. That is, the hole EH1 may be provided to have a taper shape from the bank 264 to the second interlayer insulation layer 232 and may be provided to have a reverse taper shape from the second interlayer insulation layer 232 to the active buffer layer 202.

The hole EH1 may be formed by removing the bank 264 and the planarization layer 250 with a photomask, performing dry etching on the passivation layer 240 and the second interlayer insulation layer 232, and performing wet etching on the first interlayer insulation layer 231, the gate insulation layer 220, and the active buffer layer 202. A process of hole EH1 the hole EH1 will be described below in detail with reference to FIG. 9.

A dummy organic layer 262' may be provided on a floor surface of the hole EH1 (i.e., the multi buffer layer 201 in the hole EH1), and a dummy electrode 263' may be provided on the dummy organic layer 262'. The dummy organic layer 262' may be formed of the same material as that of the organic light emitting layer 262, and the dummy electrode 263' may be formed of the same material as that of the second electrode 263.

In detail, in a case where the organic light emitting layer 262 is formed by an evaporation deposition process, the step coverage characteristic is not good. The step coverage may denote that a layer deposited by a deposition process is formed so as to be connected without being disconnected at the portions where the steps are formed. When the step coverage characteristic is not good, the organic light emitting layer 262 may be disconnected where a reverse taper shape is formed. Therefore, the organic light emitting layer 262 may be formed so as to be disconnected in the hole EH1. Accordingly, the dummy organic layer 262' including the same material as that of the organic light emitting layer 262 may be formed on the multi buffer layer 201 in the hole EH1.

Moreover, the second electrode 263 may be formed by a physical vapor deposition process such as a sputtering process. In this case, a step coverage characteristic is better than the evaporation deposition process, but the second electrode 263 may be disconnected where a reverse taper shape is formed. Therefore, the second electrode 263 may be formed so as to be disconnected in the hole EH1. Accordingly, the dummy electrode 263' including the same material as that of the second electrode 263 may be formed on the dummy organic layer 262' in the hole EH1.

The organic light emitting layer 262 and the second electrode 263 may also be provided on the bank 264, the planarization layer 250, the passivation layer 240, and the second interlayer insulation layer 232 in the hole EH1.

The inorganic layer 271 of the encapsulation layer 130 may be formed through an atomic layer deposition (ALD) process or a chemical vapor deposition (iCVD) process using an initiator. In this case, since a step coverage characteristic is good, the inorganic layer 271 may be formed without being disconnected in a reverse taper shape. Accordingly, the inorganic layer 271 may be formed so as to be connected without being disconnected in the hole EH1.

The organic layer 272 may be formed to have a sufficient thickness, for acting as a particle cover layer which prevents particles from penetrating into the light emitting layer 262 and the second electrode 263, and thus, may be filled into the hole EH1. The hole EH1 may be provided to have a taper shape from the bank 264 to the second interlayer insulation layer 232 and may be provided to have a reverse taper shape from the second interlayer insulation layer 232 to the active buffer layer 202, and a width W2 in a middle portion of the hole EH1 may be set narrower than a width W1 in an inlet of the hole EH1 and a width 3 in a floor of the hole EH1. Therefore, since the organic layer 272 is provided on the organic light emitting layer 262 and the second electrode 263, the organic layer 272 may fix the organic light emitting layer 262 and the second electrode 263. Accordingly, the organic light emitting layer 262 is prevented from being peeled due to a stress which occurs when an organic light emitting display apparatus is folded or bent.

As described above, in embodiments of the present disclosure, the hole EH1 may be provided to have a taper shape from the bank 264 to the second interlayer insulation layer 232 and may be provided to have a reverse taper shape from the second interlayer insulation layer 232 to the active buffer layer 202, and the organic layer 272 of the encapsulation layer 130 covering the first electrode 261, the organic light emitting layer 262, and the second electrode 263 may be filled into the hole EH1. As a result, according to embodiments of the present disclosure, since the organic layer 272 of the encapsulation layer 130 fixes the organic light emitting layer 262 and the second electrode 263, the organic light emitting layer 262 is prevented from being peeled by a stress which occurs when the organic light emitting display apparatus is folded or bent.

Figure 8:
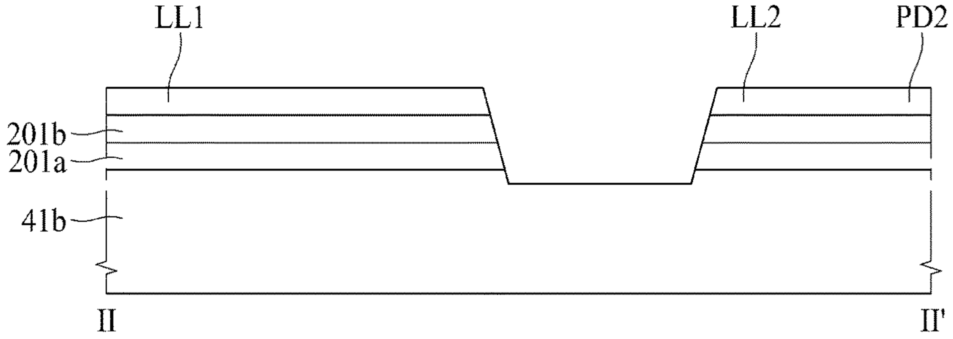
FIG. 8 is a cross-sectional view illustrating an example taken along line □-□' of FIG. 6.

FIG. 8 is a cross-sectional view illustrating an example taken along line □-□' of FIG. 6.

In FIG. 8, a first link line LL1, a second link line LL2, a second pad PD2, and a cross-sectional surface between the first link line LL1 and the second link line LL2 are illustrated.

The pad part 43 may be provided in the bending part 45 of the substrate 41, and a small number of inorganic layers may be provided in the bending part 45 of the substrate 41, for minimizing cracks which occur in the inorganic layers when the bending part 45 is bent. Therefore, only first and second buffer layers 201*a* and 201*b* of the multi buffer layer 201 may be provided in the pad part 43 provided in the bending part 45 of the substrate 41.

In the pad part 43, the first buffer layer 201*a* may be provided on the substrate 41, and the second buffer layer 201*b* may be provided on the first buffer layer 201*a*. The first link line LL1, the second link line LL2, and the second pad PD2 may be provided on the second buffer layer 201*b*.

Moreover, the first and second buffer layers 201*a* and 201*b* may not be provided between link lines and between pads in the bending part 45 of the substrate 41, for minimizing cracks which occur in the inorganic layers when the bending part 45 is bent. For example, as in FIG. 8, buffer layers may not be provided between the first link line LL1 and the second link line LL2.

Figure 9:
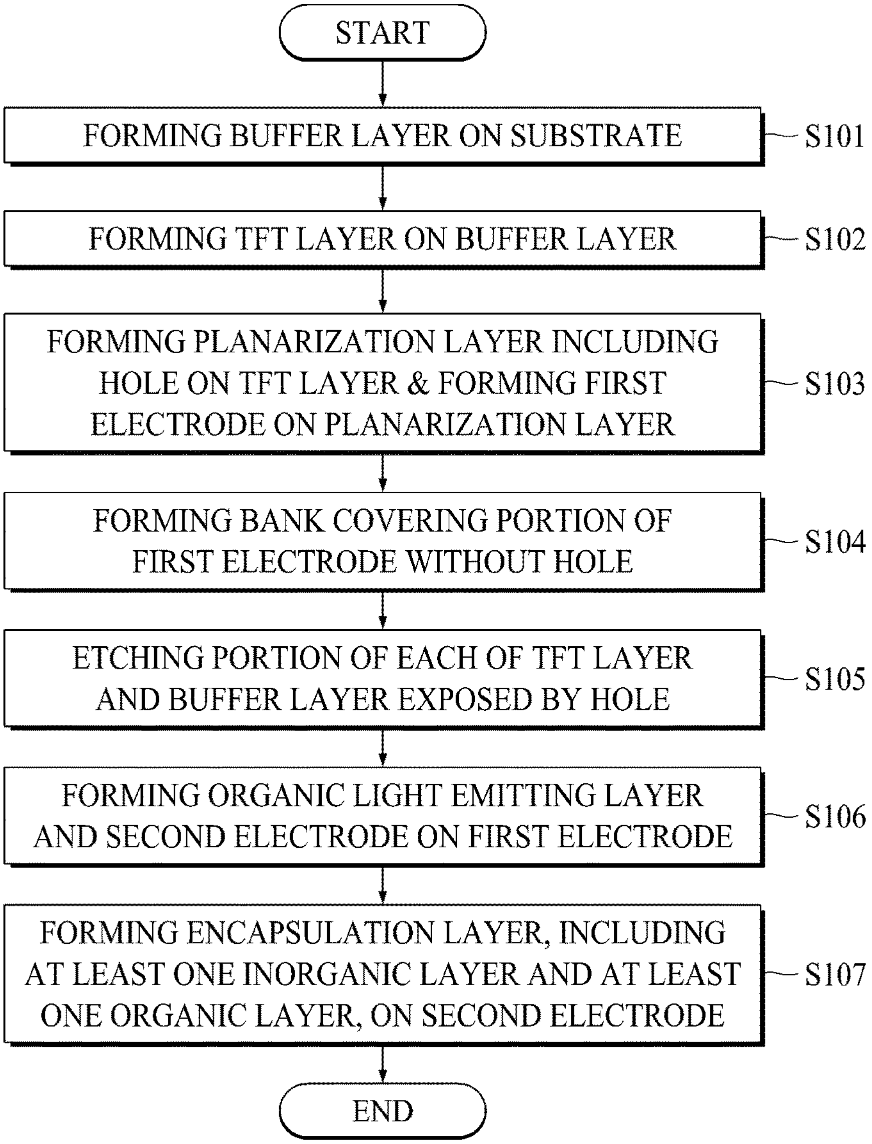
FIG. 9 is a flowchart illustrating a method of manufacturing an organic light emitting display apparatus according to an embodiment of the present disclosure.

FIG. 9 is a flowchart illustrating a method of manufacturing an organic light emitting display apparatus according to an embodiment of the present disclosure. FIGS. 10A to 10F are cross-sectional views taken along line I-I' of FIG. 5 for describing the method of manufacturing the organic light emitting display apparatus illustrated in FIG. 9. FIGS. 11A to 11E are cross-sectional views taken along line □-□' of FIG. 6 for describing the method of manufacturing the organic light emitting display apparatus illustrated in FIG. 9.

Hereinafter, a method of manufacturing an organic light emitting display apparatus according to an embodiment of the present disclosure will be described in detail with reference to FIGS. 9, 10A to 10F, and 11A to 11E.

Figure 10A:
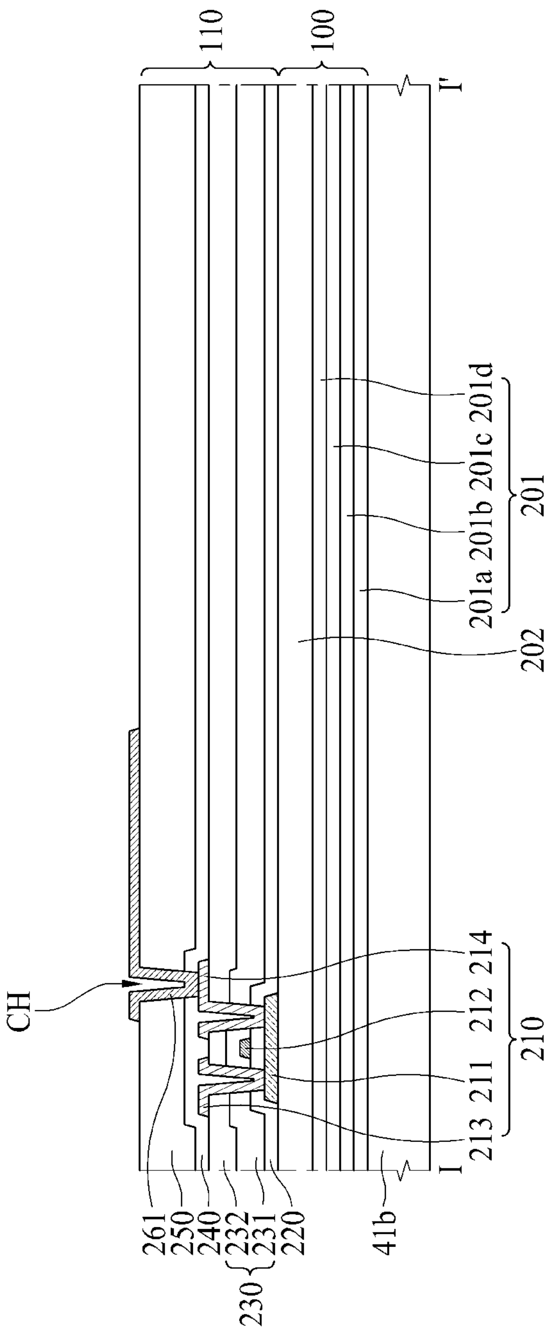
FIGS. 10A to 10F are cross-sectional views taken along line I-I' of FIG. 5 for describing the method of manufacturing the organic light emitting display apparatus illustrated in FIG. 9.
Figure 11A:
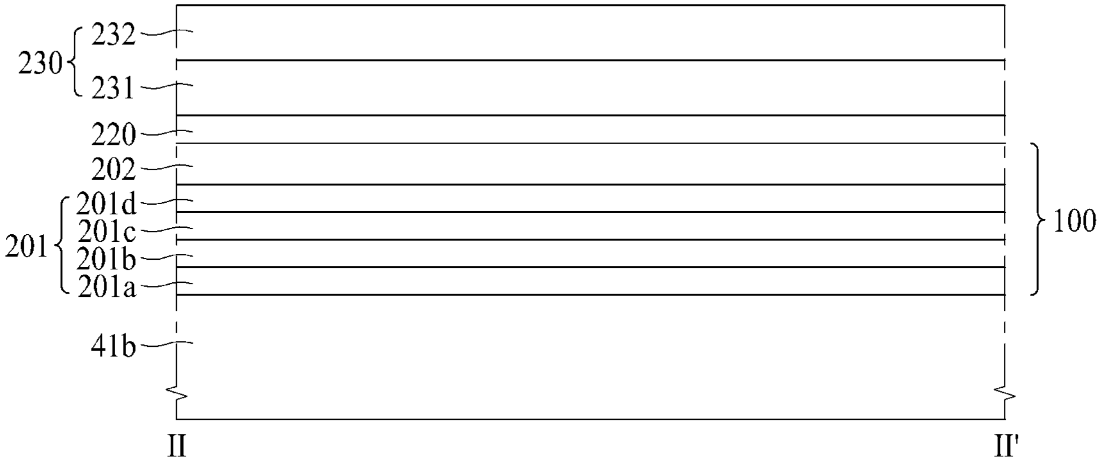
FIGS. 11A to 11E are cross-sectional views taken along line □-□' of FIG. 6 for describing the method of manufacturing the organic light emitting display apparatus illustrated in FIG. 9.

First, referring to FIGS. 10A and 11A, a buffer layer 100 including a multi buffer layer 201 and an active buffer layer 202 may be formed on a substrate 41. (S101 of FIG. 9)

In detail, a plurality of buffer layers (for example, first to fourth buffer layers) 201*a* to 201*d* which are alternately stacked may be formed on the substrate 41. In this case, the first and third buffer layers 201*a* and 201*c* may each be formed of SiOx, and the second and fourth buffer layers 201*b* and 201*d* may each be formed of SiNx.

The active buffer layer 202 may be disposed on the multi buffer layer 201. The active buffer layer 202 may be formed of SiOx.

Second, referring to FIGS. 10A and 11A, a TFT layer 110 may be formed on the buffer layer 100. (S102 of FIG. 9)

In detail, the active layer 211 may be formed on the buffer layer 100. The active layer 211 may be formed of a silicon-based semiconductor material, an oxide-based semiconductor material, or the like. The silicon-based semiconductor material may use amorphous silicon or polycrystalline silicon which has mobility better than amorphous silicon, is low in consumption power, and is good in reliability.

Examples of the silicon-based semiconductor material may include an InSnGaZnO-based material which is four-element metal oxide, an InGaZnO-based material, an InSnZnO-based material, an InAlZnO-based material, a SnGaZnO-based material, an AlGaZnO-based material, and a SnAlZnO-based material which are three-element metal oxide, and an InZnO-based material, SnZnO-based material, AlZnO-based material, ZnMgO-based material, SnMgO-based material, InMgO-based material, InGaO-based material, which are two-element metal oxide, InO-based material, SnO-based material, and ZnO-based material, but a composition ratio of elements is not limited thereto.

The active layer 211 may include a source region and a drain region which includes p-type or n-type impurities, and a channel formed between the source region and the drain region, and may include a low concentration doping region between the source region and the drain region adjacent to the channel.

A light blocking layer for blocking external light incident on the active layer 211 may be provided between the buffer layer 110 and the active layer 211.

A gate insulation layer 220 may be formed on the active layer 211. The gate insulation layer 220 may be formed of an inorganic layer, and for example, may be formed of SiOx, SiNx, or a multilayer thereof.

A gate electrode 212, scan lines, and initialization voltage lines VRL may be provided on the gate insulation layer 220. The gate electrode 212, the scan lines, and the initialization voltage lines VRL may each be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

An interlayer insulation layer 230 may be provided on the gate electrode 212, the scan lines, and the initialization voltage lines VRL. The interlayer insulation layer 230 may include a first interlayer insulation layer 231 and a second interlayer insulation layer 232. The first interlayer insulation layer 231 may be formed of SiOx, and the second interlayer insulation layer 232 may be formed of SiNx.

A source electrode 213, a drain electrode 214, data lines, and first source voltage lines VDDL may be provided on the interlayer insulation layer 230. Each of the source electrode 213 and the drain electrode 214 may be connected to the active layer 211 through a contact hole which penetrates the gate insulation layer 220 and the interlayer insulation layer 230. The source electrode 213, the drain electrode 214, the data lines, and VDDL may each be formed of a single layer or a multilayer which includes one of Mo, Al, Cr, Au, Ti, Ni, Nd, and Cu, or an alloy thereof.

Third, referring to FIG. 10A, a passivation layer 240 is formed before a planarization layer 250 including a hole EH1 may be formed on the TFT layer 110, and a first electrode 261 may be formed on the planarization layer 250. (S103 of FIG. 9)

In detail, a passivation layer 240 for insulating TFTs 210 may be provided on the source electrode 213, the drain electrode 214, the data lines, and the first source voltage lines VDDL. The passivation layer 240 may be formed of SiNx.

A planarization layer 250 for planarizing a step height caused by the TFTs 210 may be formed on the passivation layer 240. The planarization layer 250 may be formed of an organic layer such as acryl resin, epoxy resin, phenolic resin, polyamide resin, polyimide resin, or the like.

Moreover, a contact hole CH which passes through the planarization layer 250 by a photomask process and passes through the passivation layer 240 by a dry etching process to expose the drain electrode 214 and a hole EH1 which passes through the planarization layer 250 by a photomask process and passes through the passivation layer 240 by a dry etching process to expose the second interlayer insulation layer 232 may be formed.

The first electrode 261 may be formed on the planarization layer 250. The first electrode 261 may be connected to the drain electrode 214 of the TFT 210 through the contact hole CH which passes through the passivation layer 240 and the planarization layer 250. The first electrode 261 may be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

Figure 10B:
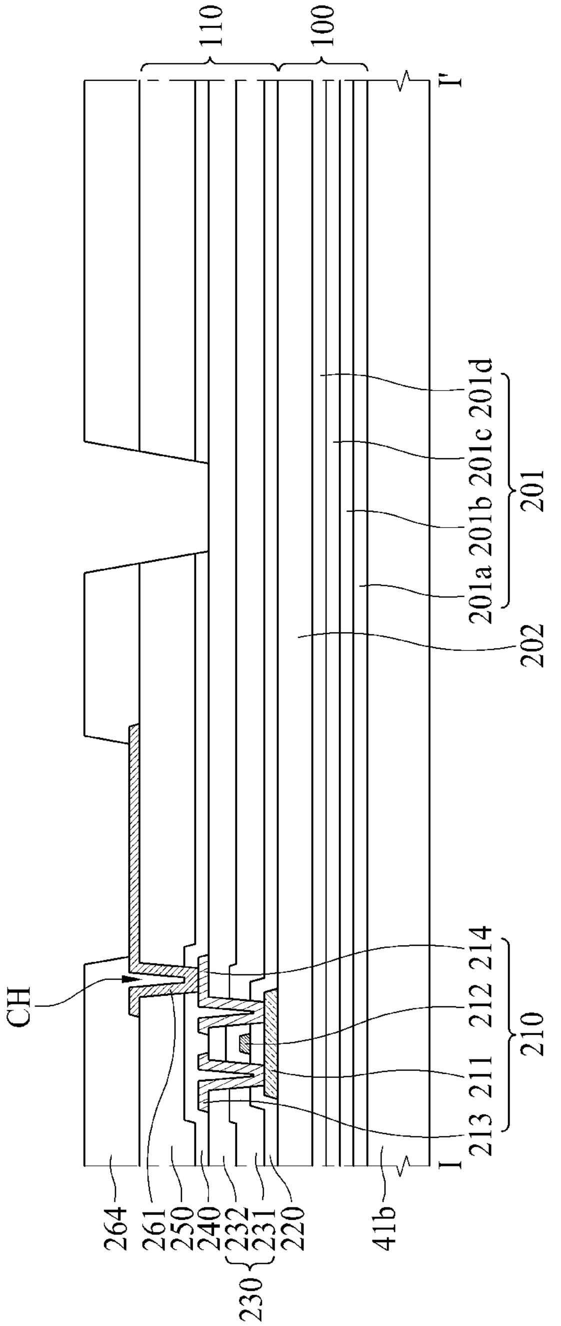

Fourth, referring to FIG. 10B, a bank 264 which covers a portion of the first electrode 261 without covering the hole EH1 may be formed. (S104 of FIG. 9)

In detail, the bank 264 may be provided on the planarization layer 250 to cover a portion of the first electrode 261. The bank 264 may be a pixel defining layer which defines emission parts of a plurality of subpixels. That is, the emission parts may each be an area where the first electrode 261, a light emitting layer (or an organic light emitting layer) 262, and a second electrode 263 are sequentially stacked, and a hole from the first electrode 261 and an electron from the second electrode 263 are combined in the light emitting layer 262 to emit light. An area where the bank 264 is provided may be a non-emission area. The bank 264 may be formed of an organic layer such as acryl resin, epoxy resin, phenolic resin, polyamide resin, polyimide resin, or the like.

Moreover, by removing the bank 264 filled into the hole EH1 using a photomask process, the hole EH1 may be formed so as not to be covered by the bank 264.

A spacer may be provided on the bank 264. The spacer may be formed of an organic layer such as acryl resin, epoxy resin, phenolic resin, polyamide resin, polyimide resin, or the like.

Fifth, as in FIGS. 10C, 10D, 11B, and 11C, a portion of each of the TFT layer 110 and the buffer layer 100 exposed by the hole EH1 may be etched. (S105 of FIG. 9)

Figure 10C:
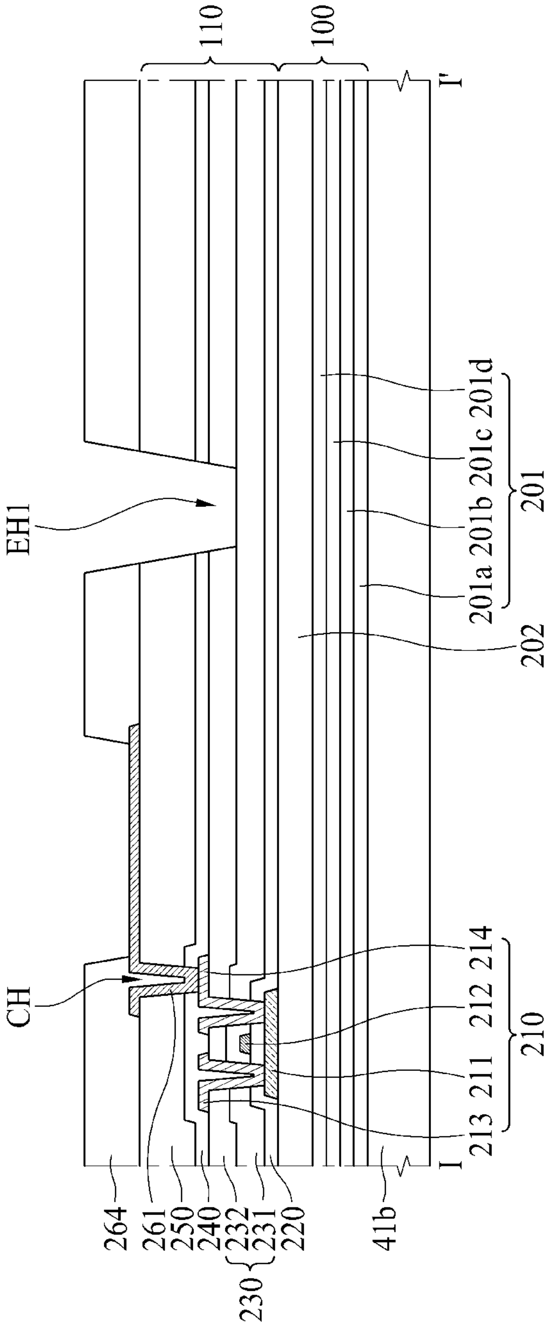
Figure 11B:
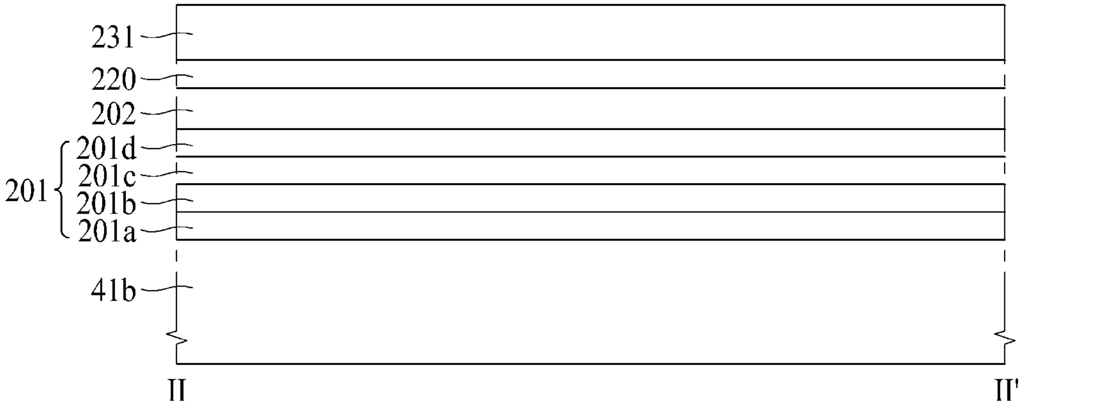

In detail, as in FIGS. 10C and 11B, the second interlayer insulation layer 232 exposed by the hole EH1 may be etched by a dry etching process.

Figure 10D:
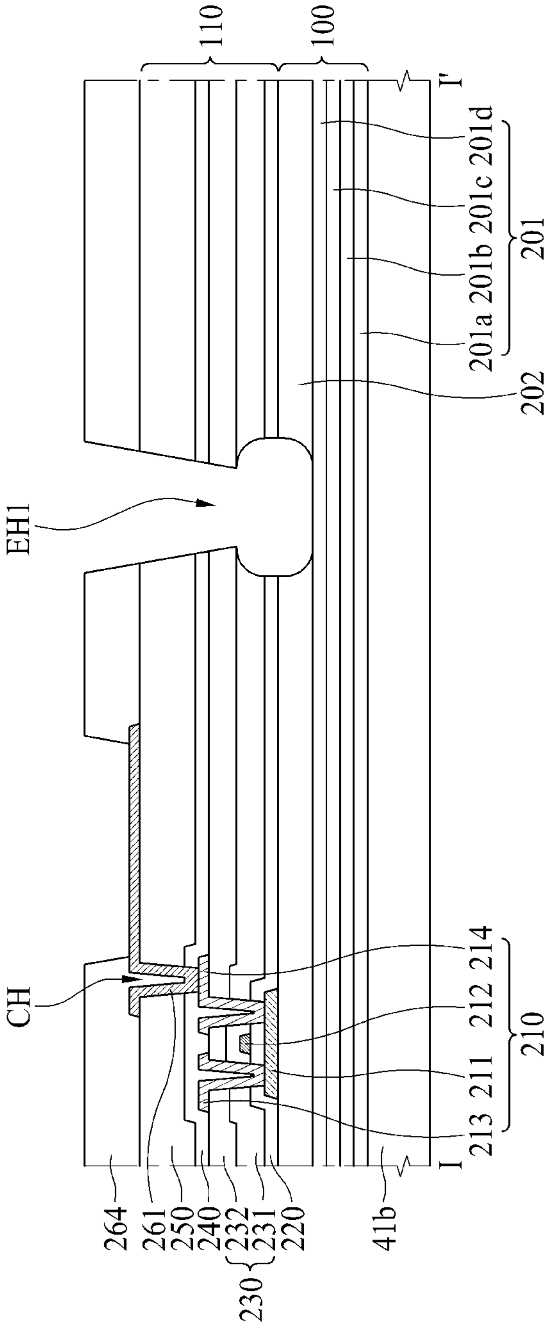
Figure 11C:
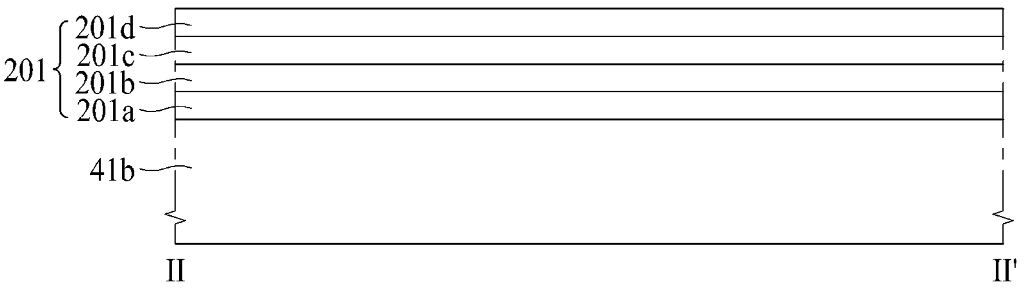
Figure 11D:
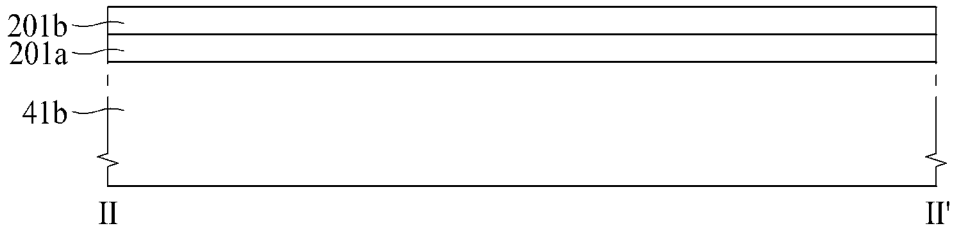

Subsequently, as in FIGS. 10D and 11C, the first interlayer insulation layer 231, the gate insulation layer 220, and the active buffer layer 202 which are exposed by the hole EH1 by removing the second interlayer insulation layer 232 may be simultaneously etched through a wet etching process. The first interlayer insulation layer 231, the gate insulation layer 220, and the active buffer layer 202 may each be formed of SiOx, and the second interlayer insulation layer 232 and a fourth buffer layer 201*d* which is an uppermost layer of the multi buffer layer 201 may each be formed of SiNx. Therefore, the first interlayer insulation layer 231, the gate insulation layer 220, and the active buffer layer 202 may be simultaneously etched by using a selective etchant which does not etch SiNx and etches SiOx. Accordingly, the second interlayer insulation layer 232 may not be etched by wet etching, and thus, a lower surface of the second interlayer insulation layer 232 may be exposed.

As described above, the hole EH1 may be formed by removing the bank 264 and the planarization layer 250 with a photomask, performing dry etching on the passivation layer 240 and the second interlayer insulation layer 232, and performing wet etching on the first interlayer insulation layer 231, the gate insulation layer 220, and the active buffer layer 202. Accordingly, the hole EH1 may be provided to have a taper shape from the bank 264 to the second interlayer insulation layer 232 and may be provided to have a reverse taper shape from the second interlayer insulation layer 232 to the active buffer layer 202, Next, as in FIG. 11D, the third and fourth buffer layers 201*c* and 201*d* may be etched through a dry etching process, and then, a plurality of link lines and a plurality of pads may be formed.

Figure 11E:
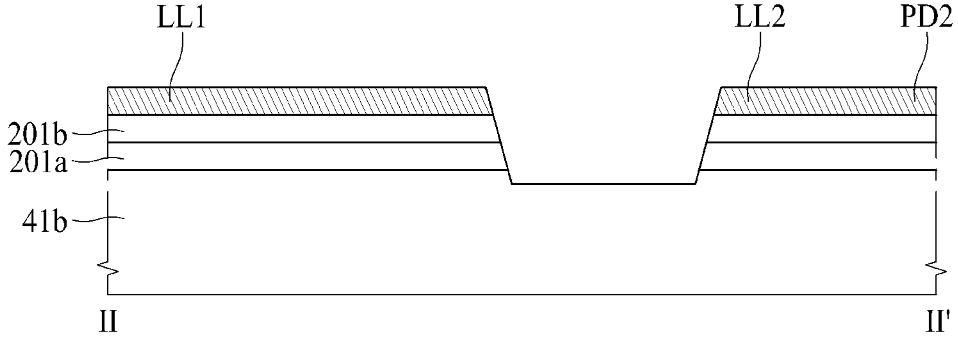

Subsequently, as in FIG. 11E, the first and second buffer layers 201*a* and 201*b* may be etched between the link lines and the pads through a dry etching process, and a portion of a plastic film 41*b* of the substrate 41 may be etched.

Figure 10E:
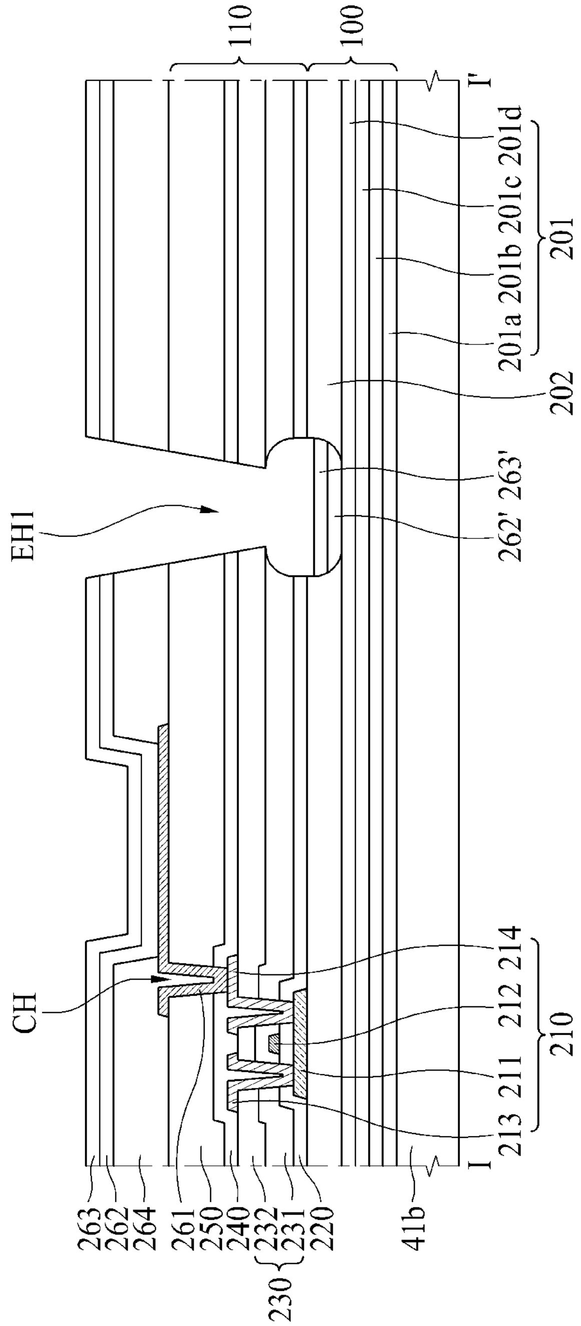

Sixth, as in FIG. 10E, the organic light emitting layer 262 and the second electrode 263 may be formed on the first electrode 261. (S106 of FIG. 9)

In detail, the light emitting layer 262 may be provided on the first electrode 261 and the bank 264. The light emitting layer 262 may include a hole transport layer, an organic light emitting layer, and an electron transport layer. The hole transport layer may smoothly transfer a hole, injected from the first electrode 261, to the organic light emitting layer. The organic light emitting layer may be formed of an organic material including a phosphorescent or fluorescent material. The electron transport layer may smoothly transfer an electron, injected from the second electrode 263, to the organic light emitting layer. The light emitting layer 262 may further include a hole injection layer (HIL), a hole blocking layer (HBL), an electron injection layer (EIL), and an electron blocking layer (EBL), in addition to the hole transport layer, the organic light emitting layer, and the electron transport layer.

Moreover, the light emitting layer 262 may be provided in a tandem structure of two or more stacks. Each of the stacks may include a hole transport layer, an organic light emitting layer, and an electron transport layer. If the light emitting layer 262 is provided in the tandem structure of two or more stacks, a charge generation layer may be provided between adjacent stacks. The charge generation layer may include an n-type charge generation layer, disposed adjacent to a lower stack, and a p-type charge generation layer which is provided on the n-type charge generation layer and is disposed adjacent to an upper stack. The n-type charge generation layer may inject an electron into the lower stack, and the p-type charge generation layer may inject a hole into the upper stack. The n-type charge generation layer may be formed of an organic layer where an organic host material having an ability to transport electrons is doped with alkali metal, such as lithium (Li), sodium (Na), potassium (K), or cesium (Cs), or alkali earth metal such as magnesium (Mg), strontium (Sr), barium (Ba), or radium (Ra). The p-type charge generation layer may be an organic layer where a dopant is doped on an organic host material having an ability to transport holes.

The light emitting layer 262 may be a common layer which is provided in the pixels in common, and in this case, may be a white light emitting layer that emits white light. However, embodiments of the present disclosure are not limited thereto. In other embodiments, the light emitting layer 262 may be provided in each subpixel, and in this case, may be divided into a red light emitting layer which emits red light, a green light emitting layer which emits green light, and a blue light emitting layer which emits blue light.

The organic light emitting layer 262 may be formed by an evaporation deposition process, and in this case, a step coverage characteristic is not good. When the step coverage characteristic is not good, the organic light emitting layer 262 may be disconnected at which a reverse taper shape is formed. Therefore, the organic light emitting layer 262 may be formed so as to be disconnected in the hole EH1. Accordingly, a dummy organic layer 262' including the same material as that of the organic light emitting layer 262 may be formed on the multi buffer layer 201 in the hole EH1.

Subsequently, the second electrode 263 may be formed on the light emitting layer 262. The second electrode 263 may be formed to cover the light emitting layer 262. The second electrode 263 may be a common layer which is formed in pixels in common.

The second electrode 263 may be formed of a transparent conductive material (or TCO), such as indium tin oxide (ITO) or indium zinc oxide (IZO) capable of transmitting light, or a semi-transmissive conductive material such as magnesium (Mg), silver (Ag), or an alloy of Mg and Ag. If the second electrode 263 is formed of a semi-transmissive conductive material, emission efficiency is enhanced by a micro-cavity. A capping layer may be formed on the second electrode 263.

Moreover, the second electrode 263 may be formed by a physical vapor deposition process such as a sputtering process. In this case, a step coverage characteristic is better than the evaporation deposition process, but the second electrode 263 may be disconnected where a reverse taper shape is formed. Therefore, the second electrode 263 may be formed so as to be disconnected in the hole EH1. Accordingly, a dummy electrode 263' including the same material as that of the second electrode 263 may be formed on the dummy organic layer 262' in the hole EH1.

The organic light emitting layer 262 and the second electrode 263 may also be formed on the side surfaces of the bank 264, the planarization layer 250, the passivation layer 240, and the second interlayer insulation layer 232 in the hole EH1.

Figure 10F:
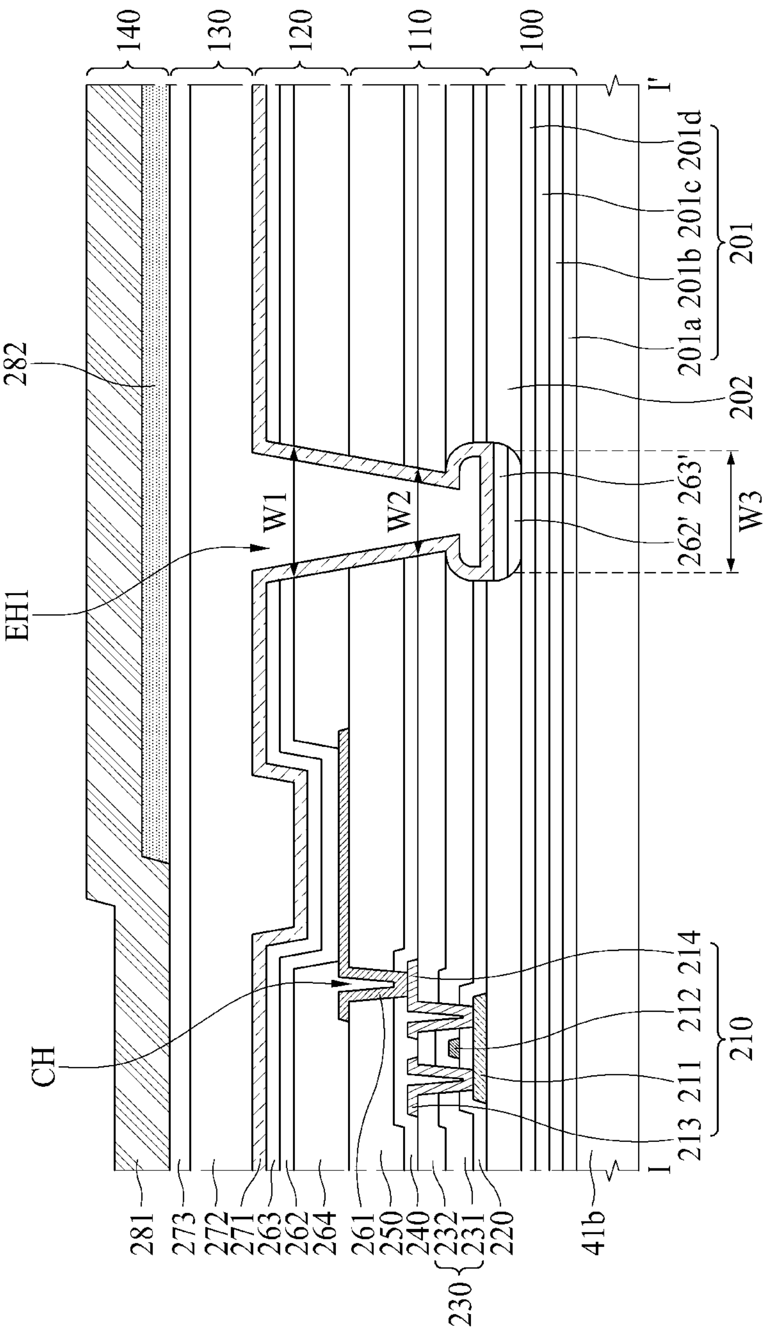

Seventh, as in FIG. 10F, an encapsulation layer 130 including at least one inorganic layers 271 and 273 and at least one organic layer 272 may be formed on the second electrode 263. (S107 of FIG. 9)

In detail, the encapsulation layer 130 may be formed on the second electrode 263. The encapsulation layer 130 prevents oxygen or water from penetrating into the light emitting layer 262 and the second electrode 263. To this end, the encapsulation layer 130 may include the at least one inorganic layers (for example, first and second inorganic layers) 271 and 273 and the at least one organic layer 272. For example, as in FIG. 10F, the first inorganic layer 271 may be formed on the second electrode 263, the organic layer 272 may be formed on the first inorganic layer 271, and the second inorganic layer 273 may be formed on the organic layer 272.

Each of the inorganic layers 271 and 273 may be formed of at least one of silicon nitride, aluminum nitride, zirconium nitride, titanium nitride, hafnium nitride, tantalum nitride, silicon oxide, aluminum oxide, and titanium oxide.

The inorganic layer 271 and 273 may be formed through an ALD process or an iCVD process using an initiator. In this case, since a step coverage characteristic is good, the inorganic layer 271 and 273 may be formed without being disconnected where a reverse taper shape is formed. Accordingly, the inorganic layer 271 and 273 may be formed so as to be connected without being disconnected in the hole EH1.

The at least one organic layer 272 may be formed to have a sufficient thickness, for acting as a particle cover layer which prevents particles from penetrating into the light emitting layer 262 and the second electrode 263. The organic layer 272 may be formed of a transparent material for transmitting light emitted from the light emitting layer 262. The organic layer 272 may be formed of an organic material for transmitting 99% of the light emitted from the light emitting layer 262, and for example, may be formed of acryl resin, epoxy resin, phenolic resin, polyamide resin, polyimide resin, and/or the like, but is not limited thereto.

The organic layer 272 may be formed to have a sufficient thickness, for acting as a particle cover layer which prevents particles from penetrating into the light emitting layer 262 and the second electrode 263, and thus, may be filled into the hole EH1. The hole EH1 may be provided to have a taper shape from the bank 264 to the second interlayer insulation layer 232 and may be provided to have a reverse taper shape from the second interlayer insulation layer 232 to the active buffer layer 202, and a width W2 in a middle portion of the hole EH1 may be set narrower than a width W1 in an inlet of the hole EH1 and a width 3 in a floor of the hole EH1. Therefore, in order to peel the organic layer 272 filled into a space where the hole EH1 is formed in a reverse taper shape, the organic layer 272 should pass through a space having a narrow width.

Also, since the organic layer 272 is formed on the organic light emitting layer 262 and the second electrode 263, the organic layer 272 may fix the organic light emitting layer 262 and the second electrode 263. Accordingly, the organic light emitting layer 262 is prevented from being peeled due to a stress which occurs when an organic light emitting display apparatus is folded or bent.

Depending on the cases, a color filter layer 140 may be provided on the encapsulation layer 130. The color filter layer 140 may include a plurality of color filters 281 and a black matrix 282. The color filters 281 may be respectively disposed in correspondence with the emission parts of the subpixels. The black matrix 282 may be disposed between adjacent color filters 281, for preventing color mixture from occurring because light emitted from one pixel travels to the color filter 281 of an adjacent pixel. The black matrix 282 may be disposed in correspondence with the bank 264. An overcoat layer may be provided on the color filters 281, for planarizing a step height caused by the color filters 281 and the black matrix 282.

A barrier film may be disposed on the color filters 281. The barrier film may be a layer for protecting a light emitting device layer 120 from oxygen or water. The barrier film may include a touch sensing layer for sensing a user touch.

Therefore, according to embodiments of the present disclosure, the hole EH1 may be formed in each subpixel in the display area DA through a process of removing an inorganic layer of the bending part 45 of the substrate 41. As a result, according to embodiments of the present disclosure, a separate process is not added for forming the hole EH1, and thus, the hole EH1 may be formed without any increase in manufacturing cost.

As described above, according to the embodiments of the present disclosure, a hole may be provided to have a taper shape from the bank to the second interlayer insulation layer and may be provided to have a reverse taper shape from the second interlayer insulation layer to the active buffer layer, and the organic layer of the encapsulation layer covering the first electrode, the organic light emitting layer, and the second electrode may be filled into the hole. As a result, according to the embodiments of the present disclosure, since the organic layer of the encapsulation layer fixes the organic light emitting layer and the second electrode, the organic light emitting layer is prevented from being peeled by a stress which occurs when the organic light emitting display apparatus is folded or bent.

Moreover, according to the embodiments of the present disclosure, the hole may be formed in each subpixel in the display area through a process of removing the inorganic layer of the bending part. As a result, according to the embodiments of the present disclosure, a separate process is not added for forming the hole, and thus, the hole may be formed without any increase in manufacturing cost.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display apparatus, comprising:

a substrate;

an organic light emitting device layer, disposed on the substrate, comprising a plurality of organic light emitting devices made of a first electrode, an organic light emitting layer, and a second electrode in an emission area;

an encapsulation layer, disposed on the organic light emitting device layer, comprising an first inorganic layer and an organic layer, and at least one hole, disposed in a non-emission area and under the encapsulation layer, wherein the encapsulation layer extends downward and fills into the at least one hole, and wherein each hole is configured so that a lower part of the hole has a larger width than at least a portion of an upper part of the hole.

2. The organic light emitting display apparatus of claim 1, wherein the organic layer is filled into the hole.

3. The organic light emitting display apparatus of claim 1, wherein the hole passes through the second electrode, the organic light emitting layer, a bank, a planarization layer, and a TFT layer, the thin film transistor (TFT) layer is on the substrate, the planarization layer is on the TFT layer, the first electrode is on the planarization layer, the bank covers a portion of the first electrode, the organic light emitting layer is on the first electrode, and the second electrode is on the organic light emitting layer.

4. The organic light emitting display apparatus of claim 3, wherein the TFT layer comprises:

a semiconductor layer disposed on a buffer layer;

a gate insulation layer disposed on the semiconductor layer;

a gate electrode disposed on the gate insulation layer;

a first interlayer insulation layer disposed on the gate electrode;

a second interlayer insulation layer disposed on the first interlayer insulation layer; and a source electrode and a drain electrode disposed on the second interlayer insulation layer, and wherein the hole passes through the second interlayer insulation layer, the first interlayer insulation layer, and the gate insulation layer.

5. The organic light emitting display apparatus of claim 4, wherein a width of the hole in the second interlayer insulation layer is narrower than a width of the hole in the first interlayer insulation layer and a width of the hole in the planarization layer.

6. The organic light emitting display apparatus of claim 4, wherein a portion of a lower surface of the second interlayer insulation layer is exposed at the hole.

7. The organic light emitting display apparatus of claim 4, further comprising the buffer layer disposed between the substrate and the TFT layer, wherein the hole is a recessed portion of the buffer layer.

8. The organic light emitting display apparatus of claim 7, wherein the buffer layer comprises:

a multi buffer layer disposed on the substrate, the multi buffer layer including first, second, third and fourth buffer layers which are sequentially stacked; and an active buffer layer disposed on the multi buffer layer, wherein the hole passes through the active buffer layer.

9. The organic light emitting display apparatus of claim 8, wherein the active buffer layer comprises a material which is the same as any one of the first buffer layer, the third buffer layer, the gate insulation layer, and the first interlayer insulation layer and differs from the second buffer layer, the fourth buffer layer, and the second interlayer insulation layer.

10. The organic light emitting display apparatus of claim 9, further comprising:

a plurality of pads and a plurality of link lines disposed on the second buffer layer in a non-display area of the substrate, wherein the first buffer layer and the second buffer layer are not provided between the plurality of pads and the plurality of link lines.

11. An organic light emitting display apparatus, comprising:

a substrate;

an organic light emitting device layer, disposed on the substrate, comprising a plurality of organic light emitting devices made of a first electrode, an organic light emitting layer, and a second electrode in an emission area;

an encapsulation layer, disposed on the organic light emitting device layer, comprising an first inorganic layer and an organic layer, and at least one hole, disposed in a non-emission area and under the encapsulation layer, wherein the encapsulation layer extends downward and fills into the at least one hole, and wherein the upper part of the hole has a taper shape and the lower part of the hole has reversed taper shape.

12. The organic light emitting display apparatus of claim 11, wherein the organic light emitting device layer further comprises a bank layer, covering a part of the first electrode of the organic light emitting device so as to define the emission area of the organic light emitting device, and the organic light emitting layer and the second electrode are sequentially provided on the first electrode and the bank layer, wherein the hole passes through the bank layer.

13. The organic light emitting display apparatus of claim 12, further comprising a thin film transistor layer, disposed between the substrate and the organic light emitting device layer and comprising a plurality of driving transistors connected to and driving the plurality of organic light emitting devices.

14. The organic light emitting display apparatus of claim 13, wherein the thin film transistor layer further comprise a passivation layer disposed on the plurality of driving transistors and a planarization layer disposed on the passivation layer, wherein the hole passes through the planarization layer and the passivation layer.

15. The organic light emitting display apparatus of claim 14, further comprising a plurality of buffer layers, disposed between the substrate and the thin film transistor layer, wherein the lower part of the hole is formed in a region including a part of insulation layers in the thin film transistor layer and a part of the buffer layers, and made of a same insulating material different from that of the layers immediately adjacent to the region.

16. The organic light emitting display apparatus of claim 15, further comprising a pad part area, disposed on the edge of the substrate, and sharing a number of lowermost buffer layers of the plurality of the buffer layers with a display area including the organic light emitting devices.

* * * * *